(12) United States Patent
Kawai

(10) Patent No.: US 6,184,560 B1
(45) Date of Patent: Feb. 6, 2001

(54) PHOTOSEMICONDUCTOR DEVICE MOUNTED STRUCTURE

(75) Inventor: Motoyoshi Kawai, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/304,559

(22) Filed: May 4, 1999

(30) Foreign Application Priority Data

May 15, 1998 (JP) .................................. 10-133458

(51) Int. Cl.⁷ .......................... H01L 29/82; H01L 23/34
(52) U.S. Cl. ..................... 257/415; 257/712; 257/713
(58) Field of Search .................... 257/415, 418, 257/420, 619, 688, 689, 712, 713, 718, 719

(56) References Cited

U.S. PATENT DOCUMENTS

| 5,035,495 | 7/1991 | Toyoda et al. . |
| 5,081,520 | 1/1992 | Yoshii et al. . |
| 5,877,903 | 3/1999 | Adachi . |
| 5,998,875 | * 12/1999 | Bodo et al. ............... 257/778 |

FOREIGN PATENT DOCUMENTS

| 0 541 386 | 5/1993 | (EP) . |
| 0 579 438 | 1/1994 | (EP) . |
| 1-138776 | 5/1989 | (JP) . |
| 2-103987 | 4/1990 | (JP) . |
| 4-72688 | 3/1992 | (JP) . |
| 5-029389 | 2/1993 | (JP) . |
| 5-29389 | 2/1993 | (JP) . |
| 5-53315 | 8/1993 | (JP) . |
| 6-310617 | 11/1994 | (JP) . |
| 7-193091 | 7/1995 | (JP) . |
| 9-36274 | 2/1997 | (JP) . |
| 9-307191 | 11/1997 | (JP) . |
| 10-090576 | 4/1998 | (JP) . |

OTHER PUBLICATIONS

"A Surface Mount Type Optical Module for Subscriber Net–works", 1995, SC–1–12, pp. 331–332, The Proceeding of the 1995 IEICE Conference.

* cited by examiner

Primary Examiner—Ngân V. Ngô
(74) Attorney, Agent, or Firm—Young & Thompson

(57) ABSTRACT

A photosemiconductor device mounted structure includes a plurality of tapered projections, a photosemiconductor device, second Au electrodes, and AuSn solder. The tapered projections are formed on a surface of an Si substrate. The photosemiconductor device has first Au electrodes. The second Au electrodes are formed on the tapered projections to correspond to the first Au electrodes. The AuSn solder bonds the first and second Au electrodes to each other.

7 Claims, 3 Drawing Sheets

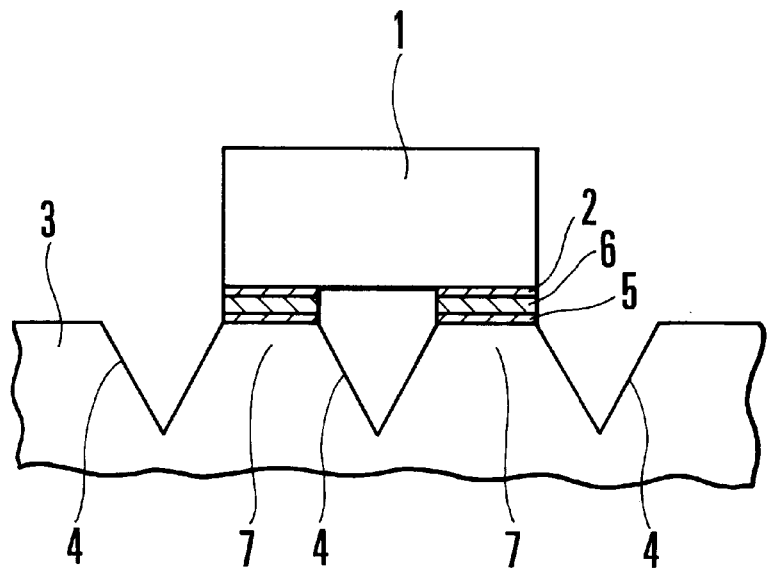
F I G. 1
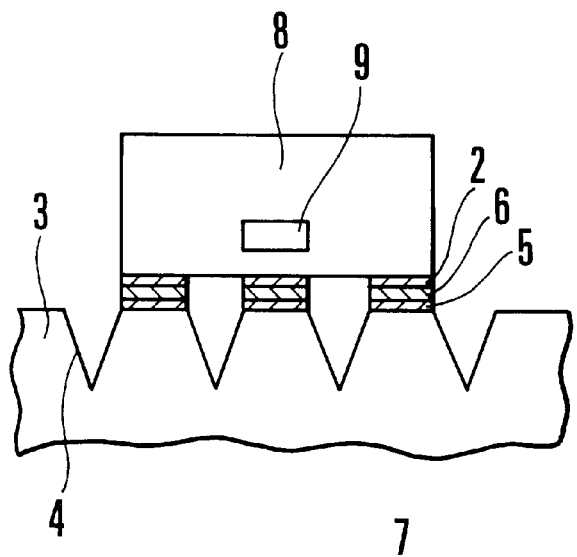
F I G. 2

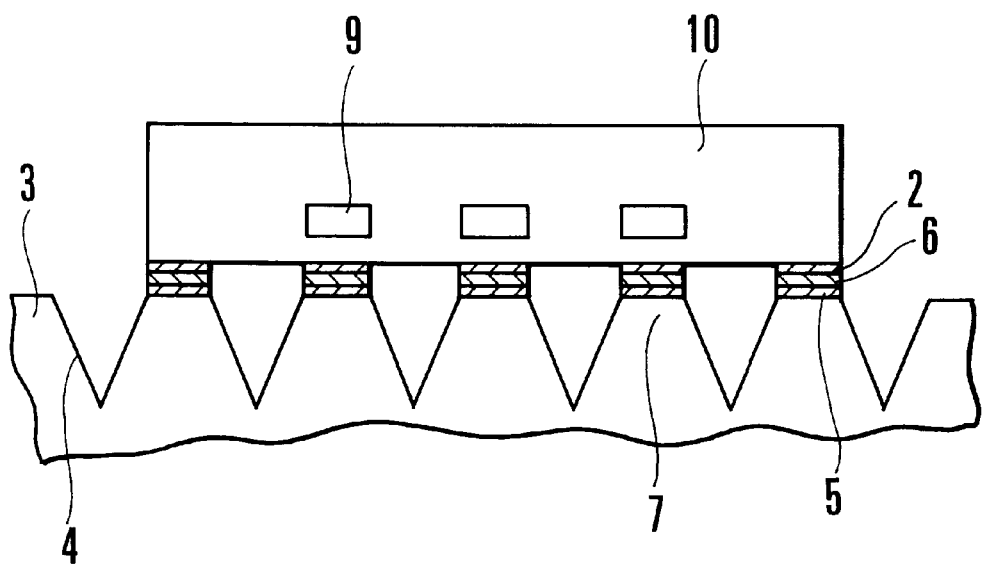
F I G. 3
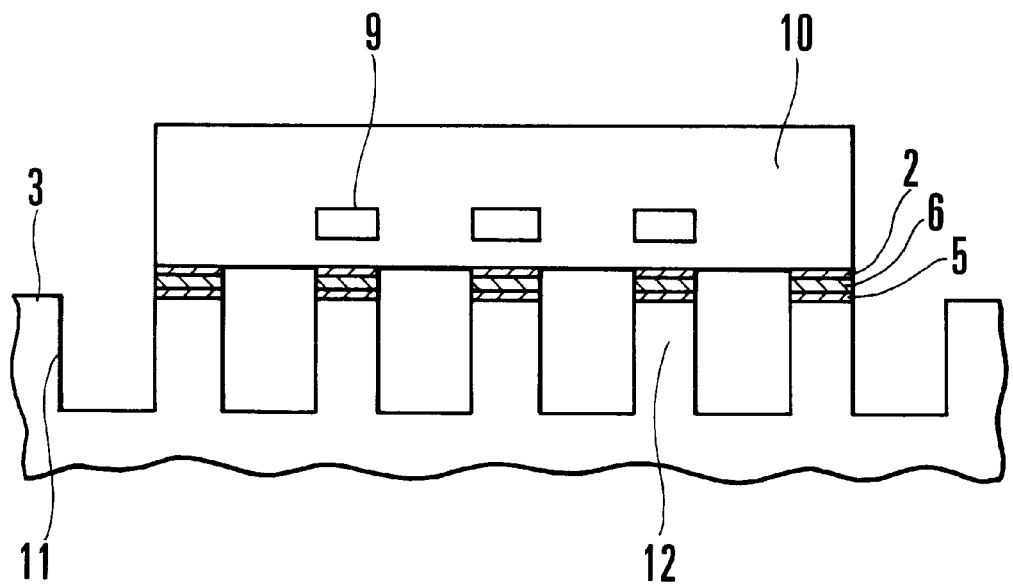
F I G. 4

PHOTOSEMICONDUCTOR DEVICE MOUNTED STRUCTURE

BACKGROUND OF THE INVENTION

The present invention relates to a photosemiconductor device mounted structure and, more particularly, to a photosemiconductor device mounted structure in which a photosemiconductor device used for an optical communication optical module is mounted on a substrate.

As a method of mounting a photosemiconductor device on a substrate, for example, Japanese Patent Publication No. 5-53315 discloses a method of forming an Sn film at a predetermined position on a substrate by vacuum deposition and fusing the Sn film and an Au electrode of the photosemiconductor device. This method requires cumbersome positioning adjustment of the photosemiconductor device and cannot meet a recent demand for cost reduction of an optical communication module.

Among modules using photosemiconductor devices, one in which a photosemiconductor device is bonded to an Si substrate with a solder of AuSn or the like is proposed. According to the characteristic feature of this bonding method, a photosemiconductor device can be located at a bonding position defined by a pad on the Si substrate without adjustment because of the self-alignment effect of the surface tension of a fused solder piece, and attracts attention as an effective means for cost reduction of a module. This optical module structure is shown in, e.g., "A Surface Mount Type Optical Module for Subscriber Networks" (proceedings of the 1995 IEICE Conference, SC-1-12) by Kurata et al.

FIG. 5 shows a conventional photosemiconductor device mounted structure using solder bonding. As shown in FIG. 5, thin AuSn solder pieces 105 are placed on pad-like Au electrodes 104 formed on an Si substrate 103 to correspond to Au electrodes 102 of a photosemiconductor device 101. The Au electrodes 102 and 104 are aligned with each other and the photosemiconductor device 101 is placed on the Si substrate 103. After that, the AuSn solder pieces 105 are fused and solidified, so that the photosemiconductor device 101 is mounted at high precision.

However, the prior art shown in FIG. 5 has problems as follows.

The first problem is as follows. Since the coefficient of thermal expansion of the photosemiconductor device and that of the Si substrate are largely different from each other, when the solder (AuSn or the like) is fused and solidified, distortion and stress occur in the photosemiconductor device. In the worst case, cracking or fracture occurs in the photosemiconductor device. This shortens the service life of the photosemiconductor device to degrade the reliability of a module using the photosemiconductor device.

Furthermore, in the case of a photosemiconductor device array, its size becomes larger than that of a photosemiconductor device since photosemiconductor devices equal in number to the number of channels are formed in it. When the photosemiconductor device array is used, not only distortion or stress but also warp or deflection occurs in it as the solder is fused and solidified. This degrades not only the service life of the photosemiconductor device array but also optical coupling of the optical fiber and the active layers (in the case of light-emitting devices) or absorption layers (in the case of light-receiving devices) of the respective channels of the photosemiconductor device array, thus degrading the reliability of the module.

The second problem is that the photosemiconductor device cannot operate stably. This is because distortion or stress occurs in the active layer (in the case of a light-emitting device) or absorption layer (in the case of a light-receiving device) of the photosemiconductor device. In particular, when a distributed feedback LD (Distributed Feedback Laser Diode; DFB-LD) is used as the photosemiconductor device, with the conventional method, distortion or stress occurs in the diffraction grating of the active layer, and stable single-mode operation is difficult to perform.

SUMMARY OF THE INVENTION

It is an object of the present invention to provide a photosemiconductor device mounted structure in which stress or distortion in the photosemiconductor device that occurs upon solder bonding or fluctuation in the ambient temperature is largely reduced to improve the reliability.

In order to achieve the above object, according to the present invention, there is provided a photosemiconductor device mounted structure comprising a plurality of projections formed on a surface of a substrate, a photosemiconductor device having first electrode pads, second electrode pads formed on the projections to correspond to the first electrode pads, and bonding means for bonding the first and second electrode pads to each other.

BRIEF DESCRIPTION OF THE DRAWINGS

FIG. 1 is a sectional view showing a photosemiconductor device mounted structure according to the first embodiment of the present invention;

FIG. 2 is a sectional view showing a photosemiconductor device mounted structure according to the second embodiment of the present invention;

FIG. 3 is a sectional view showing a photosemiconductor device mounted structure according to the third embodiment of the present invention;

FIG. 4 is a sectional view showing a photosemiconductor device mounted structure according to the fourth embodiment of the present invention.

DESCRIPTION OF THE PREFERRED EMBODIMENTS

Figure 5:
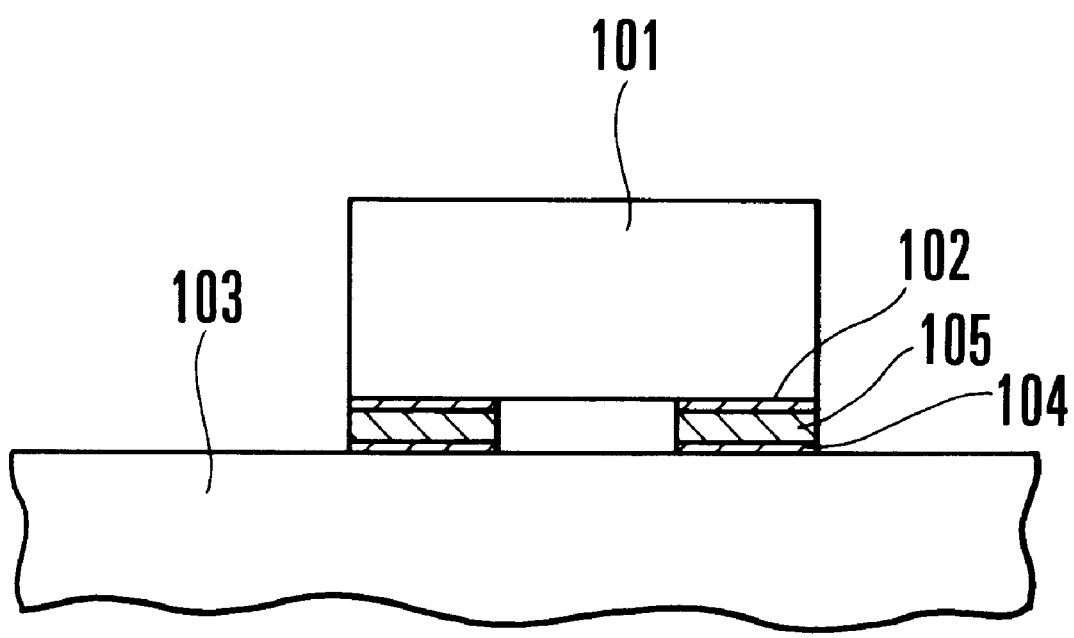
FIG. 5 is a sectional view showing a conventional photosemiconductor device mounted structure.

The present invention will be described in detail with reference to the accompanying drawings.

(First Embodiment)

FIG. 1 shows a photosemiconductor device mounted structure according to the first embodiment of the present invention. As shown in FIG. 1, Au electrodes 2 serving as metal pads on the lower surface of a photosemiconductor device 1 are bonded to Au electrodes 5 serving as metal pads on an Si substrate 3 through AuSn solder 6. Three V-grooves 4 parallel to each other and two tapered projections 7 sandwiched by the adjacent V-grooves 4 are formed on the surface of the Si substrate 3. Each tapered projection 7 has a trapezoidal section. The Au electrodes 5 are respectively formed on the upper surfaces of the two tapered projections 7 to correspond to the Au electrodes 2 of the photosemiconductor device 1. The gap between the tapered projections 7 is equal to or slightly smaller than the width of the photosemiconductor device 1.

The photosemiconductor device 1 can be either a light-emitting device such as a laser diode (LD), or a light-receiving device such as a photodiode (PD).

A mounting method for the photosemiconductor device mounted structure having this arrangement will be described.

The AuSn solder 6 is placed on the Au electrodes 5 on the two tapered projections 7. The Au electrodes 2 are aligned with the Au electrodes 5, and the photosemiconductor device 1 is mounted on the Si substrate 3. The AuSn solder 6 is fused and solidified to fix the photosemiconductor device 1 to the tapered projections 7 of the Si substrate 3.

If two tapered projections are not formed and a photosemiconductor device is to be fixed on a flat Si substrate with AuSn solder, when the fused AuSn solder solidifies, large distortion or stress occurs in the photosemiconductor device due to the large difference in coefficient of thermal expansion between the photosemiconductor device and the Si substrate. In the structure shown in FIG. 1, the photosemiconductor device 1 is bonded to the Si substrate 3 by using the two tapered projections 7. Hence, when the AuSn solder solidifies or the ambient temperature varies, as the photosemiconductor device 1 and Si substrate 3 shrink, the tapered projections 7 elastically deform. As a result, the residual stress or distortion in the photosemiconductor device 1 is largely reduced.

(Second Embodiment)

FIG. 2 shows a photosemiconductor device mounted structure according to the second embodiment of the present invention. FIG. 2 shows a case using a light-emitting device such as an LD device as a photosemiconductor device. In FIG. 2, elements identical to those of the first embodiment are denoted by the same reference numerals as in the first embodiment.

As shown in FIG. 2, four V-grooves 4 parallel to each other and three tapered projections 7 sandwiched by adjacent ones of the V-grooves 4 are formed on the surface of an Si substrate 3. Au electrodes 5 are formed on the upper surfaces of the three tapered projections 7 to correspond to Au electrodes 2 of a photosemiconductor device 1. The Au electrodes 2 formed on the lower surface of a light-emitting device 8 are bonded to the Au electrodes 5 on the Si substrate 3 through AuSn solder 6.

The light-emitting device 8 is positioned and fixed on the Si substrate 3 so that its active layer 9 corresponds to the central one of the three tapered projections 7. Thus, heat generated by the active layer 9 of the light-emitting device 8 is effectively dissipated from the central tapered projection 7.

In the mounted structure of this embodiment as well, when the fused solder solidifies or the ambient temperature fluctuates, the tapered projections 7 elastically deform to largely reduce residual stress or distortion in the light-emitting device 8, thus improving the reliability of the light-emitting device 8, as a matter of course.

(Third Embodiment)

FIG. 3 shows a photosemiconductor device mounted structure according to the third embodiment of the present invention. FIG. 3 shows a case wherein a three-channel light-emitting device array is used as the photosemiconductor device. In FIG. 3, elements identical to those of the first embodiment are denoted by the same reference numerals as in the first embodiment.

Referring to FIG. 3, six V-grooves 4 parallel to each other and five tapered projections 7 sandwiched by adjacent ones of the V-grooves 4 are formed on the surface of an Si substrate 3. Au electrodes 5 are formed on the upper surfaces of the five tapered projections 7 to correspond to Au electrodes 2 on the lower surface of a light-emitting device array 10. The Au electrodes 2 of the light-emitting device array 10 are bonded to the Au electrodes 5 on the Si substrate 3 through AuSn solder 6. The light-emitting device array 10 is fixed to the Si substrate 3 with the AuSn solder 6 such that its active layers 9 are aligned with the three central ones of the five tapered projections 7.

When the light-emitting device array 10 is compared to the single photosemiconductor device 1 shown in FIG. 1, its width increases by the number of channels, leading to a large size. Then, when the AuSn solder 6 solidifies or is fixed, stress or distortion in the light-emitting device array 10 increases to sometimes warp or deflect it. Regarding this, in the structure shown in FIG. 3, since the five tapered projections 7 elastically deform, the residual stress or distortion, or warp or deflection, in the light-emitting device array 10 can be suppressed.

This improves the reliability of the light-emitting device array 10. In addition, since warp or deflection of the light-emitting device array 10 can be prevented, degradation in optical coupling of active layers 9 of the light-emitting device array 10 and an optical fiber (not shown) can be prevented, and the reliability of an optical module using this light-emitting device array 10 can be improved.

Since the light-emitting device array 10 generates heat in channels, the amount of heat generated by the entire light-emitting device array 10 increases. If, however, the tapered projections 7 are formed to be aligned with the positions of the active layers 9, as in this embodiment, heat generated by the respective active layers 9 of the light-emitting device array 10 can be effectively dissipated by the respective tapered projections 7. As a result, the heat dissipation characteristics of the light-emitting device array 10 are also improved.

In this embodiment, the six V-grooves 4 parallel to each other are formed in the Si substrate 3 to form the five tapered projections 7 corresponding to the Au electrodes 2 and the active layers 9 of the light-emitting device array 10. Alternatively, in place of the tapered projections 7, rectangular projections 12 as shown in FIG. 4 may be formed to correspond to the positions of Au electrodes 2 and active layers 9 of a light-emitting device array 10. In this case, the rectangular projections 12 are formed by rectangular grooves 11 formed in an Si substrate 3.

In this structure as well, since the rectangular projections 12 elastically deform, stress or distortion, or warp or deflection, of a light-emitting device array 10 which occurs when fused AuSn solder 6 solidifies or the ambient temperature varies can be suppressed.

Si is used in the above embodiments as the material of the Si substrate 3. If a material such as a ceramic material is used, no problem occurs. The AuSn solder 6 is used to bond the Au electrodes 2 and 5 to each other. If a solder, e.g., PbSn solder, having different components is used, no problem occurs.

The present invention has the following effects.

First, the reliability of the photosemiconductor device can be improved. This is because stress or distortion occurring in the photosemiconductor device during solder bonding can be largely reduced, and cracking or fracture of the photosemiconductor device can accordingly be prevented.

Second, the photosemiconductor device can operate stably. This is because stress or distortion occurring in the active layer (in the case of an LD device) or absorption layer (in the case of a PD device) of the photosemiconductor device can be largely reduced. In particular, when a DFB-LD device is used as the photosemiconductor device, no stress or distortion occurs in the active layer formed with a diffraction grating, and accordingly stable single-mode oscillation is enabled.

Third, even if the ambient temperature varies, the reliability of the photosemiconductor device can be improved due to the following reason. Although the difference in coefficient of thermal expansion between the Si substrate and the photosemiconductor device produces stress or distortion in the photosemiconductor device when the ambient temperature varies, the projections of the Si substrate elastically deform to moderate distortion or stress applied to the photosemiconductor device according to the mounted structure of the present invention.

What is claimed is:

1. A semiconductor device mounting structure comprising a plurality of elastically deformable projections formed on a surface of a substrate, each of said plurality of elastically deformable projections having a conductive contact in registration with a corresponding electrode of the semiconductor device, said plurality of elastically deformable projections absorbing heat from the semiconductor device and elastically deforming so as to reduce a residual stress in the semiconductor device during use at the time of soldering the semiconductor to said substrate.

2. The structure of claim 1, further comprising a hollow space between an adjacent pair of said plurality of elastically deformable projections.

3. The structure of claim 2, wherein said hollow space comprises a V-groove and each of said projections has a trapezoidal cross-section.

4. The structure of claim 2, wherein said hollow space comprises a rectangular groove and each of said projections has a rectangular cross-section.

5. A structure for mounting a semiconductor device, the structure comprising a plurality of projections extending from a substrate in a first direction, wherein each of said plurality of projections has a conductive layer comprising a solder for contacting a corresponding electrode of the semiconductor device, and wherein each of said plurality of projections has a height and width above said substrate so that each of said projections is designed and adapted to flex in a second direction perpendicular to the first direction to compensate for heat-induced expansion differences between said substrate and the semiconductor device during use.

6. The structure of claim 5, wherein said substrate comprises one of silicon and a ceramic material, said substrate having a high heat conductivity.

7. The structure of claim 5, wherein said solder comprises one of AuSn and PbSn.

* * * * *